(12) United States Patent
Carnevale et al.

(10) Patent No.: US 7,558,132 B2
(45) Date of Patent: Jul. 7, 2009

(54) IMPLEMENTING CALIBRATION OF DQS SAMPLING DURING SYNCHRONOUS DRAM READS

(75) Inventors: Michael Joseph Carnevale, Rochester, MN (US); Daniel Frank Moertl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 11/693,812

(22) Filed: Mar. 30, 2007

(65) Prior Publication Data

US 2008/0239841 A1      Oct. 2, 2008

(51) Int. Cl.
    *G11C 11/00*   (2006.01)
(52) U.S. Cl. ........................ 365/193; 365/201
(58) Field of Classification Search ................ 365/193, 365/201
    See application file for complete search history.

(56) References Cited

U.S. PATENT DOCUMENTS

| | | | |
|---|---|---|---|
| 6,316,980 B1 * | 11/2001 | Vogt et al. ................ | 327/273 |
| 6,369,670 B1 * | 4/2002 | Rowell ..................... | 333/139 |
| 6,442,102 B1 * | 8/2002 | Borkenhagen et al. . | 365/233.13 |
| 6,760,856 B1 | 7/2004 | Borkenhagen et al. | |
| 6,940,760 B2 | 9/2005 | Borkenhagen et al. | |

* cited by examiner

*Primary Examiner*—Michael T Tran
(74) *Attorney, Agent, or Firm*—Joan Pennington

(57) ABSTRACT

A method and calibration apparatus implement calibration of sampling of a data strobe signal (DQS) during synchronous dynamic random access memory (DRAM) reads. A calibration control is provided to enable calibration testing. A selected one of a received DQS signal and an internal Enable signal is driven onto a data mask (DQM) IO during a DRAM read for calibration testing. The received DQS signal and the internal Enable signal are used to adjust the Enable delay to generally center the preamble time at the DQS receiver.

17 Claims, 3 Drawing Sheets

IMPLEMENTING CALIBRATION OF DQS SAMPLING DURING SYNCHRONOUS DRAM READS

FIELD OF THE INVENTION

The present invention relates generally to the data processing field, and more particularly, relates to a method and apparatus for implementing calibration of sampling of a data strobe signal (DQS) during synchronous dynamic random access memory (DRAM) reads.

Description of the Related Art

As computers and computer processors increase in performance, memory access performance becomes a significant bottleneck on overall system performance. The interface technology utilized to communicate data between a memory device and memory controller or other form of application device in particular can be a significant source of such a bottleneck.

For dynamic random access memory (DRAM) devices, which are commonly used as the main working memory for a computer, various interconnect technologies have been developed over the years. One such interconnect technology is used for synchronous DRAMs, or SDRAMs, which utilize a form of source synchronous interface, where the source of data during a memory transfer is relied upon to provide a clock signal, often referred to as a data strobe signal (DQS), that is used by a target for the data to capture such data as it is being transferred over a data line to the target. In particular, the capture of data on a data line is typically gated by the rising or falling edge of the data strobe signal (DQS), for example, so that the value stored on a data line when the data strobe signal transitions from low to high, or visa-versa, will be latched into a data latch in the target.

In some known applications, the memory controller drives the clock to the DDR DRAM devices, along with data, and tags. The DDR DRAM can be placed far apart from the memory controller. Also individual bytes of the DDR DRAM can be placed at different distances from the memory controller. For example, one application places two bytes within 2 inches of the memory controller, four bytes 7 inches away and four bytes 9 inches away across a connector and onto another card. In a SDRAM source synchronous interface, the memory controller typically initiates all memory transfers, and generates the base clock from which the SDRAM operates.

When memory controllers read from DDR DRAM devices, a single ended or differential strobe (DQS) is driven from the DDR DRAM device back to the memory controller that is then used to latch the DRAM output data on each transitioning edge of the strobe. There are always an even number of DQS strobe transitions and the data capturing logic in the memory controller will falsely latch data if the DQS strobe is in a state were the voltage level of the strobe is neither a logic 0 or 1, but instead is high impedance Z. Two critical periods when the DQS strobe can be in one of these ambiguous states include the time period before the DQS preamble and the time period after the DQS postamble.

On reads from DDR DRAM devices, the DDR DRAM drives back the DQS, it is difficult for the memory controller to determine when the DQS, at the memory controller's receiver is in the preamble time period due to the round trip delay, particularly when supporting large differences in DRAM bus net lengths.

U.S. Pat. No. 6,760,856 to John Michael Borkenhagen et al., issued Jul. 6, 2004 and assigned to the present assignee, discloses a programmable compensated delay for a double data rate (DDR) synchronous dynamic random access memory (SDRAM) interface. A programmable compensated delay apparatus includes a reference delay calibration circuit for providing a measured number of delay elements in one cycle. A programmable delay register provides a desired delay value. A conversion logic is coupled to the reference delay calibration circuit and the programmable delay register for receiving both the measured number of delay elements in one cycle and the desired delay value. The conversion logic provides a number of required delay elements. A delay circuit is coupled to the conversion logic for receiving the number of required delay elements and providing the desired delay. A SDRAM control logic provides a refresh start signal to the reference delay calibration circuit for updating the delay circuit during each DRAM refresh. The DQS clock strobe on the DDR SDRAM is applied to the delay circuit and is delayed by the desired delay.

U.S. Pat. No. 6,940,760 to John Michael Borkenhagen et al., issued Sep. 6, 2005, and assigned to the present assignee, discloses a circuit arrangement and method used in connection with a data latch that is coupled to a data source over a source synchronous communications interface to disable the data latch from latching data whenever the data source is not driving the source synchronous data strobe signal. As such, when the data source is not driving the source synchronous data strobe signal, undesired and/or inadvertent latching by the data latch can be avoided. Moreover, in implementations where a data strobe signal line is bidirectional, and capable of being driven either by the data source or by another circuit used to access the data source (e.g., a memory controller), disabling data latching can minimize the risk of driver damage resulting from conflicting attempts to drive the data strobe signal line at both ends.

A need exists for an effective mechanism for implementing calibration of sampling of a data strobe signal (DQS) during synchronous dynamic random access memory (DRAM) reads. It is desirable to provide a method to effectively determine, for example, a correct counter value for a desired delay for sampling of the data strobe signal (DQS).

SUMMARY OF THE INVENTION

Principal aspects of the present invention are to provide a method and apparatus for implementing calibration of sampling of a data strobe signal (DQS) during synchronous dynamic random access memory (DRAM) reads. Other important aspects of the present invention are to provide such method and apparatus for implementing calibration of sampling of a data strobe signal (DQS) during synchronous dynamic random access memory (DRAM) reads substantially without negative effect and that overcome many of the disadvantages of prior art arrangements.

In brief, a method and calibration apparatus are provided for implementing calibration of sampling of a data strobe signal (DQS) during synchronous dynamic random access memory (DRAM) reads. A calibration control is provided to enable calibration testing. A selected one of a received DQS signal and an internal Enable signal is driven onto a data mask (DQM) IO during a DRAM read for calibration testing. The received DQS signal and the internal Enable signal are used to adjust the Enable delay to generally center the preamble time at the DQS receiver.

In accordance with features of the invention, additional IO for calibration is not required. The calibration control includes a control bit used to disable the calibration function for normal memory operabon. During normal operation, the data mask (DQM) IO is only used for DRAM writes. The calibration control includes a second control bit applied to a multiplexer having an output that drives the selected one of the received DQS signal and the internal Enable signal onto a data mask (DQM) IO during a DRAM read for calibration testing. The second control bit is used to select either the received DQS signal or the internal Enable signal to be driven onto a data mask (DQM) IO during calibration testing. For each byte of data on the DRAM interface there is a bundle of nets, the bundle includes a plurality of DATA bits, the DQM and the DQS. Two control bits for calibration testing are provided for each bundle.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a calibration method and apparatus is provided that focuses on the DQS preamble and determines when to start allowing the internal circuitry inside the memory controller to start sampling the returned DQS strobe from the memory device.

Figure 1:
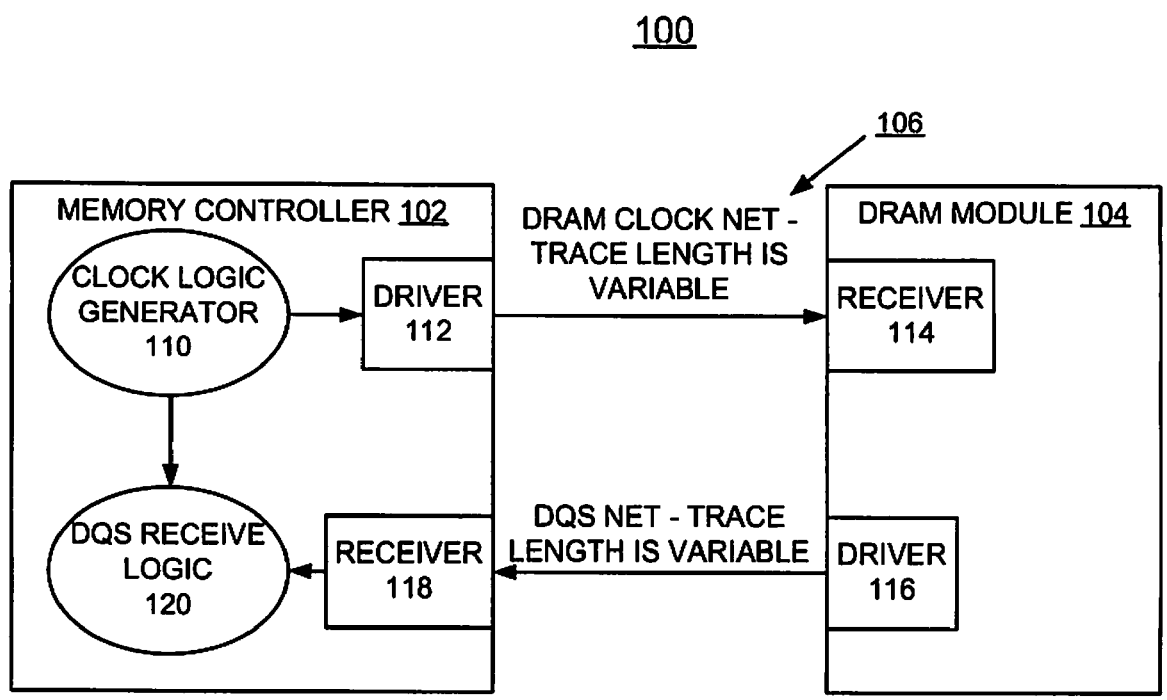
FIG. 1 is a block diagram representation illustrating an exemplary synchronous dynamic random access memory (DRAM) system for implementing calibration of sampling of a data strobe signal (DQS) during synchronous dynamic random access memory (DRAM) reads in accordance with the preferred embodiment.

Having reference now to the drawings, in FIG. 1, there is shown exemplary synchronous dynamic random access memory (DRAM) system generally designated by the reference character 100 for implementing calibration of sampling of a data strobe signal (DQS) during synchronous dynamic random access memory (DRAM) reads in accordance with the preferred embodiment. SDRAM system 100 includes a memory controller 102 coupled to a DRAM module 104, such as a DDR SDRAM, over a source synchronous communications interface 106.

Source synchronous communications interface 106 is, for example, a DDR SDRAM memory interface of the type as defined by the JEDEC Double Data Rate (DDR) SDRAM Specification, JESD79 (June 2000). It should be understood that the present invention, however, is not limited to use in such an environment.

Control signals such as a clock signal, row address strobe (RAS) signal, column address strobe (CAS) signal, address signals, and other handshaking-type signals are driven by memory controller 102 and received by memory 104. To perform data transfer, one or more data lines, referred to as DQ lines, as well as the data strobe line (DQS), are provided between memory controller 102 and DRAM module 104.

For writes to the DDR DRAM module 104, the memory controller 102 including a clock logic generator 110, and a driver 112 drives the clock, DQS, tags and data to a receiver 114 of the DDR DRAM module 104. For a read operation, DRAM 104 serves as the source providing DQS, and data DQ to a receiver 116 of the memory controller 102. The memory controller 102 includes DQS receive logic 120 coupled to the receiver 116.

For each byte of data on the DRAM interface 106 there is a bundle of nets, a bundle is made up of 8 DATA bits, 1 DQM and 1 DQS. For example, the DQS is signal ended for DDR1 DRAM and differential for DDR2 DRAM or DDR3 DRAM. The DATA and DQS nets are bidirectional, DQM is only driven from the memory controller to the DRAM, and DQM is only functionally used on writes to DRAM. These 10 IO books of 8 DATA bits, 1 DQM and 1 DQS advantageously are placed close together on the die to avoid skew, and are carefully routed on the substrate and card to keep net lengths and skew matching.

Figure 3:
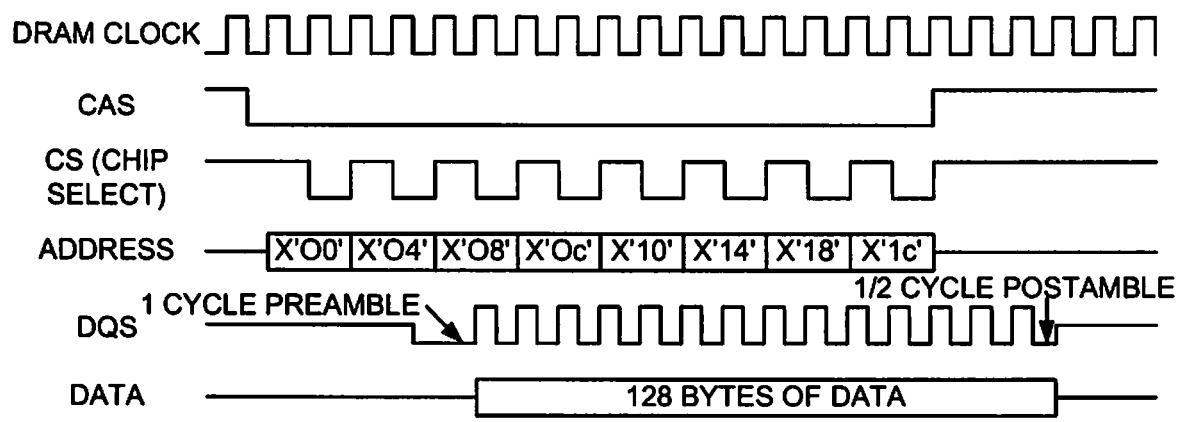
FIG. 3 is a timing diagram illustrating exemplary signals including the data strobe signal (DQS) during a synchronous dynamic random access memory (DRAM) read in accordance with the preferred embodiment.

Referring also to FIG. 3, the DQS signal requires a one clock cycle preamble and a one-half clock cycle postamble. During the preamble and postamble, DQS must be driven low. The DQS preamble is provided when the memory controller 102 issues a read command to the DDR device and after a specific time delay based on the DRAM bus clock the DDR device 104 transitions the DQS strobe from high Z to a logic 0 for one cycle before it starts transitioning the strobe.

When the DQS preamble period has actually occurred at the input to the DQS receiver 116 of the memory controller 102 can be very difficult to detect. If the DRAM modules 104 are in close proximity of the memory controller 102, the preamble will occur rather quickly, as the DRAM modules physically move further away from the memory controller, the preamble occurs later in time, this round trip net delay can be longer than the one cycle preamble time. The memory controller 102 cannot start sampling DQS until the preamble has occurred because it might falsely detect a strobe when DQS is in the high Z state and the memory controller can not start sampling DQS after the preamble has finished because it might miss the first DQS strobe.

The time it takes DQS to transition to the preamble period is a function of several factors. As illustrated in FIG. 1, these factors are, the memory controller driver delay of the DRAM clock driver 108, the trace length of the DRAM clock between the memory controller 102 and the DDR memory device 104, the trace length of the DQS signal from the DDR memory device 104 and the memory controller 104, and the delay of DQS receiver 116 of the memory controller 102.

Also some delay is associated with circuits internal to the memory controller 102. The above-identified U.S. Pat. No. 6,940,760 solves this problem by implementing a synchronous enable signal that is used to gate the returned DQS from the DRAM. This enable signal becomes active after the start of the preamble and disables the data latch from latching data whenever the data source is not driving the source synchronous data strobe signal. The enable signal can be adjusted in sub fractions of a cycle to make the enable signal earlier or later. A programmable counter is used to add or subtract delay to the enable signal, since the granularity of this counter is a fraction of a cycle, the enable signal can be adjusted earlier or later in very small increments. Ultimately the enable signal should delay the sampling of DQS to around the midpoint of the preamble, allowing for margin in both directions if the preamble should shift directions due to process variations in the memory controller and memory. The problem with this method is how can one determine what the correct counter value for the desired delay should be in order to allow for these process variations.

An internal enable signal of the type disclosed in the above-identified U.S. Pat. No. 6,940,760 is used with the calibration method and apparatus of the present invention. The subject matter of the above-identified U.S. Pat. No. 6,940,760 is incorporated herein by reference.

In accordance with features of the invention, calibration logic is provided to calibrate the DQS enable delay by multiplexing either the received DQS signal or an internal Enable signal onto the DQM IO during a DRAM read. This allows those nets to be observed on the card, so the Enable delay can be adjusted to center the preamble time at the receiver for each card application. A control bit in the memory controller 102 advantageously is used to disable this function for normal memory use.

With this invention on-die skew is minimized since the received DQS, or the internal Enable signal is driven out onto its bundle's DQM pin. By using an existing IO book, DQM, this invention requires minimal area on the die to implement.

There are advantages of the present invention, because ASIC signal IO is expensive. There are limited signal IO available for a certain die size, and adding additional IO for calibration can cause a die size increase which causes the price to increase. IO books also have large cell counts and consume available circuit area on the die. Since this invention does not require multiplexing the received DQS and the delayed enable signal onto other ASIC IO, for example, many tracks away from the placed DRAM control logic, the calibration is accurate and precise with the use of the data mask IO.

Figure 2:
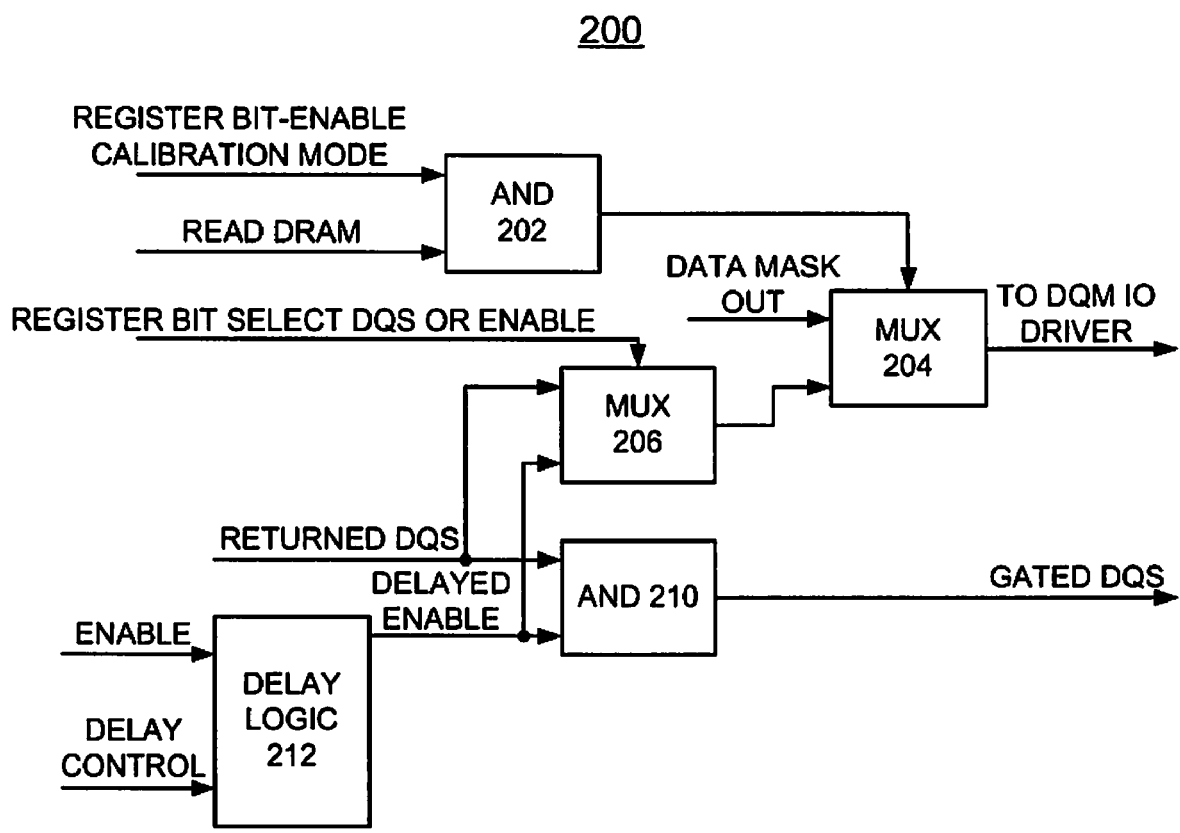
FIG. 2 is a block diagram representation illustrating an exemplary calibration apparatus in accordance with the preferred embodiment.

Referring now to FIG. 2, there is shown an exemplary calibration apparatus generally designated by the reference character 200 in accordance with the preferred embodiment. Calibration apparatus 200 includes a first AND gate 202 receiving a calibration enable input REGISTER BIT-ENABLE CALIBRATION MODE and a read input READ DRAM. Calibration apparatus 200 includes a first two input multiplexer MUX 204 receiving a first input of DATA MASK OUT and a second input from an output of a second multiplexer MUX 206. The first MUX 204 receiving a select input of the output of AND gate 202 selects the input of DATA MASK OUT during normal operation, and selects the output of the second MUX 206 during the calibration mode in accordance with the preferred embodiment.

A second calibration select input REGISTER BIT SELECT DQS OR ENABLE is applied to the second MUX 206, which receives a first input RETURNED DQS and a second input DELAYED ENABLE. The internal Enable signal ENABLE is applied to a delay logic 208, which also receives a delay control input and provides the second input DELAYED ENABLE applied to the MUX 206. A second AND gate 210 receives a first input RETURNED DQS and a second input DELAYED ENABLE providing an output GATED during normal operation.

Two register bits REGISTER BIT-ENABLE CALIBRATION MODE, REGISTER BIT SELECT DQS OR ENABLE per bundle are provided and used to enable calibration of the enable delay, for example, during an initial card lab bring-up of DRAM system 100 in order to center sampling of the DQS around the midpoint of the preamble. To achieve this without adding ASIC IO, these register bits are used to enable the internally received DQS signal, for a bundle under test, to be driven back out on its Data Mask (DQM) bit during a DRAM read, and to also enable another bundles delayed enable signal at the AND gate 210 to be driven out on its DQM bit during a DRAM read. The DQM bits are used on DRAM writes, and are not used on DRAM reads. Any bundles DQM can be used to display the internal delayed enable signal if the delay is set the same for both bundles. With these two signals now available at the DQM ASIC IO pins, an oscilloscope can be used to observe these signals to determine the delay setting needed, for that particular type of card, to center the delayed enable signal at or near the midpoint of the preamble. This calibration method and apparatus are repeated for each DQS signal. Because the DQM IO books have been placed right next to the DQS IO book and another DQM IO book has been placed right next to the delayed enable signal, the calibration is accurate and precise.

While the present invention has been described with reference to the details of the embodiments of the invention shown in the drawing, these details are not intended to limit the scope of the invention as claimed in the appended claims.

What is claimed is:

1. A method for implementing calibration of sampling of a data strobe signal (DQS) during synchronous dynamic random access memory (DRAM) reads, said method comprising:

providing a calibration control to enable calibration testing including providing a control bit used to disable the calibration function for normal memory operation;

driving a selected one of a received DQS signal and an internal Enable signal onto a data mask (DQM) IO during a DRAM read for calibration testing; and responsive to the received DQS signal and the internal Enable signal, adjusting an Enable delay to substantially center a preamble time of the DQS at a DQS receiver.

2. The method for implementing calibration of sampling of a data strobe signal (DQS) as recited in claim 1 wherein providing a calibration control to enable calibration testing includes providing a control bit applied to a multiplexer having an output that drives the selected one of the received DQS signal and the internal Enable signal onto a data mask (DQM) IO during a DRAM read for calibration testing.

3. The method for implementing calibration of sampling of a data strobe signal (DQS) as recited in claim 1 wherein during normal operation, the data mask (DQM) IO is only used for DRAM writes, eliminating a requirement of additional IO for calibration testing.

4. The method for implementing calibration of sampling of a data strobe signal (DQS) as recited in claim 1 includes providing a bundle of nets for each byte of data on a DRAM interface, the bundle including a plurality of DATA bits, the DQM and the DQS.

5. The method for implementing calibration of sampling of a data strobe signal (DQS) as recited in claim 4 includes providing said calibration control to enable calibration testing for each bundle.

6. The method for implementing calibration of sampling of a data strobe signal (DQS) as recited in claim 4 includes providing two control bits to enable calibration testing for each bundle.

7. An apparatus for implementing calibration of sampling of a data strobe signal (DQS) during synchronous dynamic random access memory (DRAM) reads comprising:

a calibration control to enable calibration testing; said calibration control including a first control bit used to disable the calibration function for normal memory operation;

a first multiplexer responsive to said calibration control driving a selected one of a received DQS signal and an internal Enable signal onto a data mask (DQM) IO during a DRAM read for calibration testing; and an Enable delay being adjusted responsive to the received DQS signal and the internal Enable signal to substantially center a preamble time of the DQS at a DQS receiver.

8. The apparatus for implementing calibration of sampling of a data strobe signal (DQS) as recited in claim 7 wherein said calibration control includes a second multiplexer for selecting between a data mask output during normal operation and an output of said first multiplexer during a DRAM read for calibration testing.

9. The apparatus for implementing calibration of sampling of a data strobe signal (DQS) as recited in claim 8 includes an AND gate receiving said first control bit and a Read DRAM signal and an output of said AND gate applied to a select input of said second multiplexer.

10. The apparatus for implementing calibration of sampling of a data strobe signal (DQS) as recited in claim 7 wherein said calibration control includes a second control bit applied to a select input of said first multiplexer.

11. The apparatus for implementing calibration of sampling of a data strobe signal (DQS) as recited in claim 7 wherein said Enable delay includes a delay logic receiving the internal Enable signal and a delay control input providing a delayed enable, and an AND gate receiving said received DQS signal and said delayed enable providing a gated DQS signal.

12. A synchronous dynamic random access memory (SDRAM) system for implementing calibration of sampling of a data strobe signal (DQS) during synchronous dynamic random access memory (DRAM) reads comprising:

a memory controller;

a DRAM module coupled to said memory controller over a source synchronous communications interface; said DRAM module including a driver driving the data strobe signal (DQS) during DRAM reads;

said memory controller including a DQS receiver receiving the data strobe signal (DQS) during DRAM reads;

said memory controller including DQS receive logic coupled to said DQS receiver including;

a calibration control to enable calibration testing;

a first multiplexer responsive to said calibration control driving a selected one of a received DQS signal and an internal Enable signal onto a data mask (DQM) IO during a DRAM read for calibration testing;

an Enable delay being adjusted responsive to the received DQS signal and the internal Enable signal to substantially center a preamble time of the DQS at a DQS receive; and during normal operation, said data mask (DQM) IO being only used for DRAM writes, eliminating a requirement of additional IO for calibration testing.

13. The synchronous dynamic random access memory (SDRAM) system as recited in claim 12 includes a bundle of nets for each byte of data on the source synchronous communications interface, the bundle including a plurality of DATA bits, the DQM and the DQS.

14. The synchronous dynamic random access memory (SDRAM) system as recited in claim 13 includes a respective one of said calibration control to enable calibration testing for each bundle.

15. The synchronous dynamic random access memory (SDRAM) system as recited in claim 13 includes a respective pair of control bits for each said calibration control to enable calibration testing for each bundle.

16. The synchronous dynamic random access memory (SDRAM) system as recited in claim 15 includes a first control bit of said respective pair of control bits used to disable the calibration function for normal memory operation.

17. The synchronous dynamic random access memory (SDRAM) system as recited in claim 15 includes a second control bit of said respective pair of control bits used to select one of the received DQS signal and the internal Enable signal during a DRAM read for calibration testing.

* * * * *